United States Patent [19]

Hayashi

[11] Patent Number: 4,937,875

[45] Date of Patent: Jun. 26, 1990

[54] AUDIO SIGNAL PROCESSING APPARATUS

[75] Inventor: Kazuhiro Hayashi, Tokyo, Japan

[73] Assignee: Pioneer Electronic Corporation, Tokyo, Japan

[21] Appl. No.: 401,299

[22] Filed: Aug. 31, 1989

[30] Foreign Application Priority Data

Mar. 28, 1989 [JP] Japan .................................... 1-77302
Mar. 28, 1989 [JP] Japan .................................... 1-77303

[51] Int. Cl.[5] ................................................ H03G 3/00

[52] U.S. Cl. ........................................ 381/63; 84/630; 84/707

[58] Field of Search ............... 381/61, 62, 63; 84/630, 84/707

[56] References Cited

U.S. PATENT DOCUMENTS 4,219,880 8/1980 Nichols ................................ 381/63
4,338,581 7/1982 Morgan ................................ 381/63
4,628,789 12/1986 Fujimori .............................. 381/63
4,638,506 1/1987 Han ...................................... 381/63
4,706,291 11/1987 Kakubo et al. ....................... 381/63

*Primary Examiner*—Forester W. Isen
*Attorney, Agent, or Firm*—Sughrue, Mion, Zinn, Macpeak & Seas

[57] ABSTRACT

An audio signal processing apparatus for digitally processing input audio signals according to the contents of a program for creating a given sound field. A basic program for creating a specific sound field is read from a first memory. The contents of the basic program are modified as required. The modified program is assigned thereto information identifying the basic program. The modified program as well as the identification information is stored in a second memory. When the modified program is read from the second memory, the information identifying that program is displayed first. After a predetermined time, the information identifying the basic program on which the modified program is based is displayed, replacing the previously displayed identification information.

4 Claims, 7 Drawing Sheets

AUDIO SIGNAL INPUT
11
A/D
5
52
FACTOR RAM
53
DELAY TIME DATA RAM
54
FOR-DELAY EXTERNAL RAM
55
USER PROGRAM RAM
51
ARITHMETIC CIRCUIT
12
D/A
AUDIO SIGNAL OUTPUT
CONTROLL-ER
9
DISPLAY
10

START
IS PARAMETER SELECTOR KEY ON?
S1
NO
YES
S2
CHANGE PARAMETER
IS PARAMETER SELECTOR KEY OFF ?
NO
S3
YES
NO
S4
IS "+" OR "–" KEY ON?
YES
CHANGE DATA
S5
IS "+" OR "–" KEY OFF?
NO
S6
ARE "+" AND "–" KEYS ON SIMULTANEOUSLY ?
YES
S7
YES
NO
IS MEMORY KEY ON?
NO
S8
YES
ADD DEFAULT PROGRAM ID NAME
S9
RESET MODIFIED CONTENTS
11
STORE USER PROGRAM WITH ID NAME IN USER PROGRAM RAM
S10
END

AUDIO SIGNAL PROCESSING APPARATUS

BACKGROUND OF THE INVENTION

1. Field of the Invention

The present invention relates to an audio signal processing apparatus and, more particularly, to an apparatus adapted to process input audio signals digitally in accordance with the contents of a program for suitably approximating or creating a desired sound field.

2. Description of the Related Art

In such auditory places as concert halls, opera houses and cabaret-like establishments giving live concerts, there is created a sound field which, with its own beautiful resonant effects, is specific to each place. How to reproduce such esthetic resonance at the highest fidelity possible in the personal listening room has long been one of the major objectives pursued by audiophiles.

Recently there have been developed and commercialized sound field creation systems for reproducing in an individual's room various sound fields approximating those of concert halls and the like. These systems are designed to create a desired sound field by digitally processing audio signals. The digital processing of these signals is based on the data gained by analyzing the acoustic space configurations of diverse places where concerts and other live performances are held. What follows is a description of the concept for artificially creating desirable sound fields.

Assume that musical instruments are being played in a concert hall, and that the sound field inside (made up of sound waves with characteristic differences in terms of delay time, direction of incoming sound, decibel level, etc.) is being observed on the time base. It will be understood that the sound waves occur in two kinds: the sounds coming directly to the audience from the instruments (hereinafter called direct sounds), and the sounds reaching the human ears after reflection against the walls and the floor of the hall (hereinafter called reflected sounds). The reflected sounds may be further divided by nature into two groups: initially reflected sounds, and subsequently reverberated sounds.

Initially reflected sounds occur about 50 to 100 milliseconds after the direct sounds reach the audience. The frequency of the reflections involved is relatively low. The presence of initially reflected sounds, or the lack of them, affects the degree of articulation of the conversations in a play and lyrics of songs that the audience can hear. In terms of auditory perception, initially reflected sounds help the audience form their sense of spaciousness and depth inside the hall. Meanwhile, subsequently reverberated sounds reach the audience following the initially reflected sounds. Echoed repeatedly against the walls and the floor and absorbed by their material upon every reflection, subsequently reverberated sounds progressively drop their decibel levels and tend to dissipate in every direction. As they reach the audience, subsequently reverberated sounds are perceived as coming in all directions with equal degrees of probability. These sounds constitute the auditory effects of resonance, richness, and ambience specific to the hall. Too high levels of the reverberated sounds tend to reduce the articulation of the conversation in a play and lyrics of songs reaching the audience.

The data gained from analyzing the acoustic space of auditory places contain numerous parameters, including initial delay, room size, liveness and reverb time. By modifying these parameters, it is possible to adjust the constitution of the echoed sounds and the audience's subjective impression affected by such sounds. Below is a description of such adjustable parameters. It should be noted that setting the same parameters for different concert halls does not create the same sound field in such places. The obvious reason is that each concert hall has its own acoustic parameters.

The initial delay is a parameter that determines the positional relation between sound sources and the audience. This parameter varies the time that elapses from the moment a direct sound reaches the audience until the moment a first initially reflected sound does. The shorter the initial delay, the shorter the perceived distance to the sound sources from the audience. Conversely, larger initial delays increase the perceived audience-to-sound-source distance.

The room size is a parameter that determines the volume of a concert hall. As shown in FIG. 1, this parameter varies the time intervals ($\Delta T_1$, $\Delta T_2$) between initially reflected sounds. The smaller the set value of the parameter, the smaller the concert hall size perceived. Larger parameter settings make the concert hall perceived more extensive.

The liveness is a parameter that determines the degree of acoustics in a given auditory place. As depicted in FIG. 2, this parameter varies the gradient of the level of initially reflected sounds in relation to time. The smaller the set value of the parameter, the more "dead" the sound field becomes (i.e., initially reflected sounds attenuate rapidly). Larger parameter settings make the sound field more "live" (i.e., initially reflected sound attenuate slowly).

The reverb time is a parameter that determines the time over which subsequently reverberated sounds attenuate. The parameter sets the time required to let a sound, after its source has become inactive, attenuate by 60 dB. The smaller the set value of the parameter, the shorter the duration of reverberation. Larger parameter settings prolong the reverb time.

These parameters are stored in computer memory after being classified into such modes as HALL1 through HALL4, JAZZ1 through JAZZ4, ROOM1, ROOM2, ROCK1, ROCK2, DISCO1, DISCO2, and CHURCH, each representing a specific type of auditory place. When a desired mode is selected to create a sound field, the parameters corresponding to that mode have their set values executed to trigger digital processing of audio signals. The result is the substantially faithful reproduction of the sound field of the desired concert hall settings in the listener's own room.

The trouble with the setup above is that if the data in each of the parameters are fixed to the modes representing various concert halls, the sound field for each mode comes out always unchanged. To avoid this boring effect, the user can create his own data based on default data and store the unique data in the user's memory. Upon reproduction, a desired sound field is created based on the corresponding sound field.

When a sound field is to be created using user-specified parameter data, it is necessary to indicate on a display the information indentifying the data specifically created by the user. On such an occasion, it is desirable to have another indication helping the user readily know the mode of the sound field (i.e., concert hall) on which the desired sound field to be created is based.

SUMMARY OF THE INVENTION

It is an object of the present invention to provide an audio signal processing apparatus having capabilities to display information identifying the mode of each sound field on the basis of which the user creates a desired sound field of his own using parameters in the form of a program that he specifies through controls of that apparatus.

An audio signal processing apparatus in accordance with the present invention is capable of digitally processing input audio signals based on the contents of the program that specifies creation of desired sound fields. The program that provides the basis for creating a desired sound field is read from a first memory. The contents of that basic program are modified as required. To this modified program is added the information identifying it along with the information identifying the basic program on which the modified program in based. These two kinds of information are stored in a second memory. When the modified program is read from the second memory, the information identifying that modified program is displayed first, followed by a display of the information identifying the program on which the modified program is based.

Figure 1:
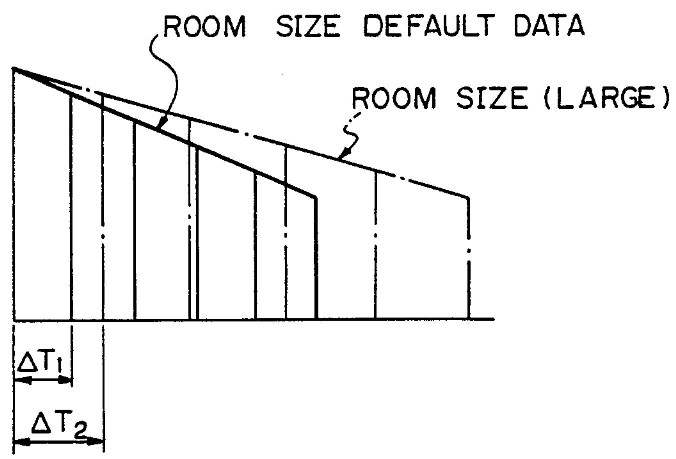
FIG. 1 is a characteristic view in effect when room size is taken as a parameter.
Figure 2:
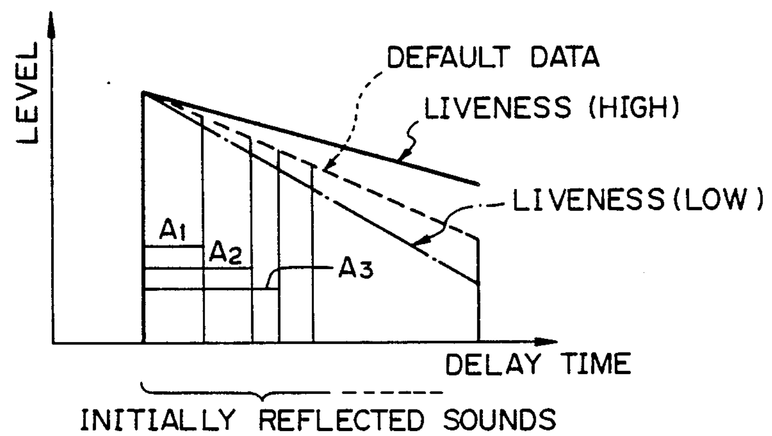
FIG. 2 is a characteristic view in effect when liveness is taken as a parameter.
Figure 3:
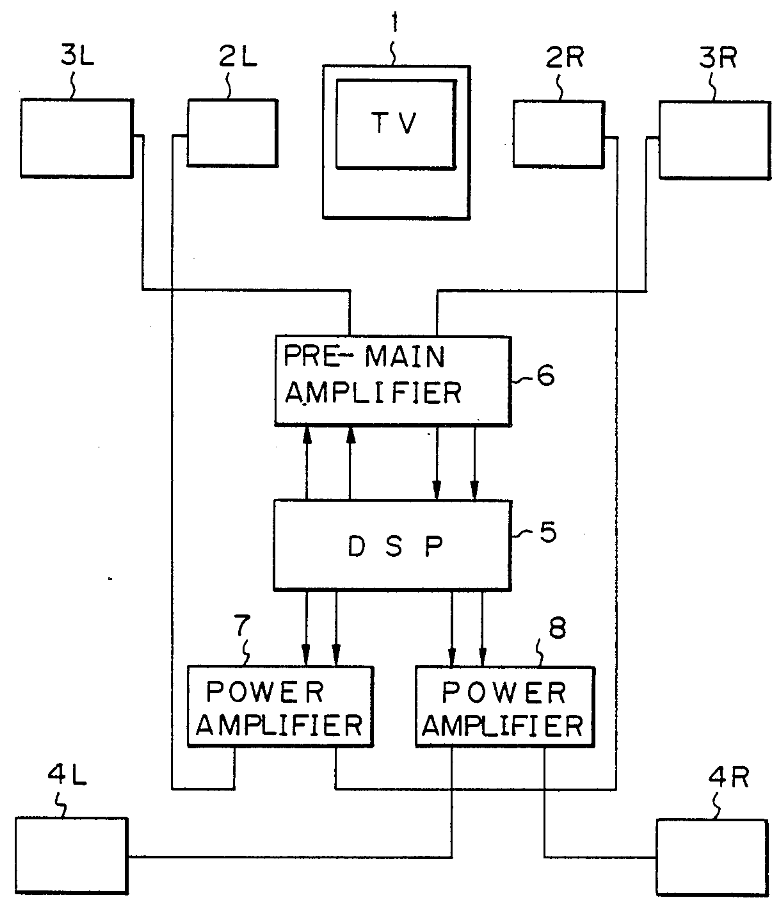
FIG. 3 is a block diagram exemplifying an embodiment of a sound field creation system to which may be adapted an audio signal processing apparatus in accordance with the present invention.

DETAILED DESCRIPTION OF THE EMBODIMENTS:

Referring first to FIG. 3, there is shown a sound field creation system wherein a TV set 1 is centrally disposed at the front, flanked by center speakers 2L and 2R. The two speakers are further flanked by left-hand and right-hand front speakers 3L and 3R. In the rear on both sides are installed left-hand and right-hand rear speakers 4L and 4R. Numeral 5 is a digitial signal processor (DSP) provided to perform various kinds of digital processing on audio signals. When digitally processed by the DSP 5, the audio signals pass through a pre-main amplifier 6 to reach the left-hand and right-hand front speakers 3L and 3R, and through power amplifiers 7 and 8 to reach left-hand and right-hand center speakers 2L and 2R, as well as right-hand and left-hand rear speakers 4L and 4R.

Figure 4:
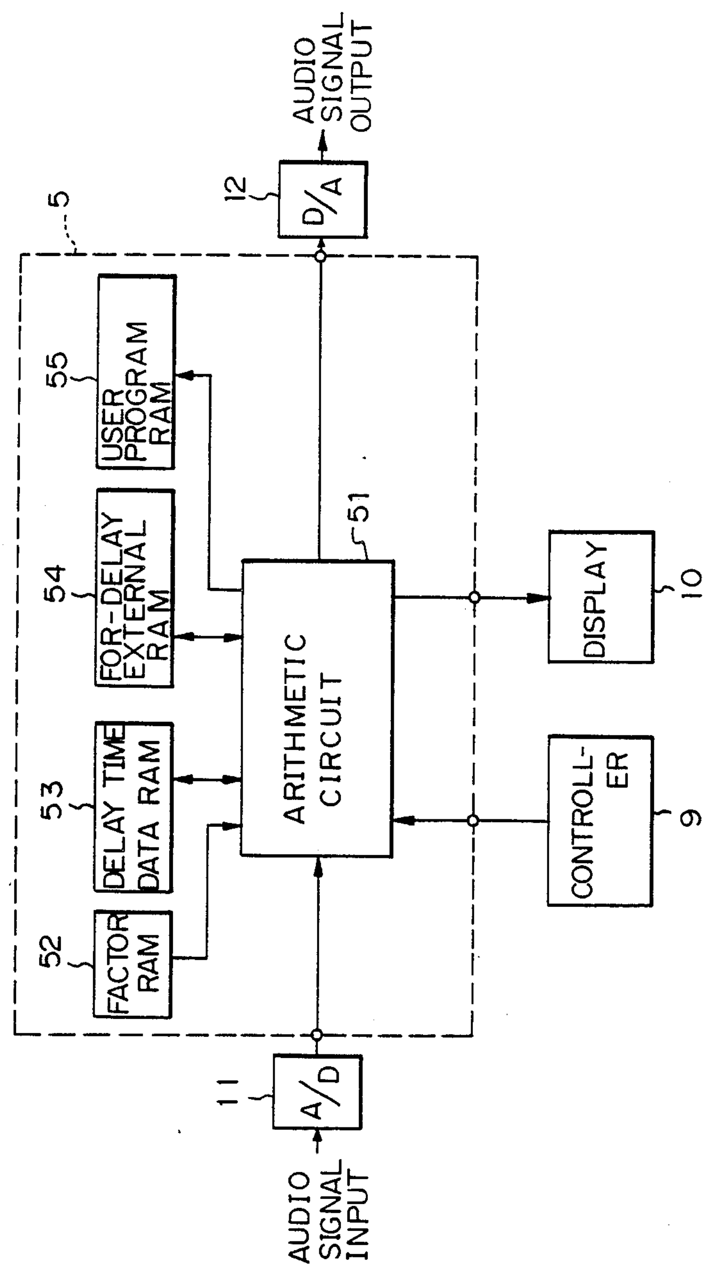
FIG. 4 is a block diagram showing an embodiment of the circuit configuration of a digital signal processor (DSP), which is an embodiment of an audio signal processing apparatus according to the present invention.

Referring to FIG. 4, there is shown an embodiment of the circuit configuration of the DSP 5 which is an audio signal processing apparatus in accordance with the present invention. The DSP 5 typically comprises: an arithmetic circuit 51 having a microcomputer arrangement and performing various arithmetic operations; a factor RAM 52 for retaining the level factors keyed to initially reflected and subsequently reverberated sounds as opposed to direct sounds; a delay time data RAM 53 for retaining the delay time data about initially reflected and subsequently reverberated sounds versus direct sounds; a for-delay external RAM 54 for retaining the data for processing actual delays based on the delay times set in the delay time data RAM 53; and a user program RAM 55 for retaining the data obtained by the user modifying default parameters. The arithmetic circuit 51 is supplied with various instruction signals from a controller 9. In addition, the arithmetic circuit 51 is so driven as to provide a number of indications on a display 10.

An input audio signal is sampled into sample values by an analog/digital (A/D) converter 11 before being supplied to the arithmetic circuit 51. Afere undergoing digital processing at the arithmetic circuit 51, the input audio signal is turned into analog form by another digital/analog (A/D) converter 12. The output from the converter 12 is fed to the pre-main amplifier 6 and the power amplifiers 7 and 8.

Figure 5:
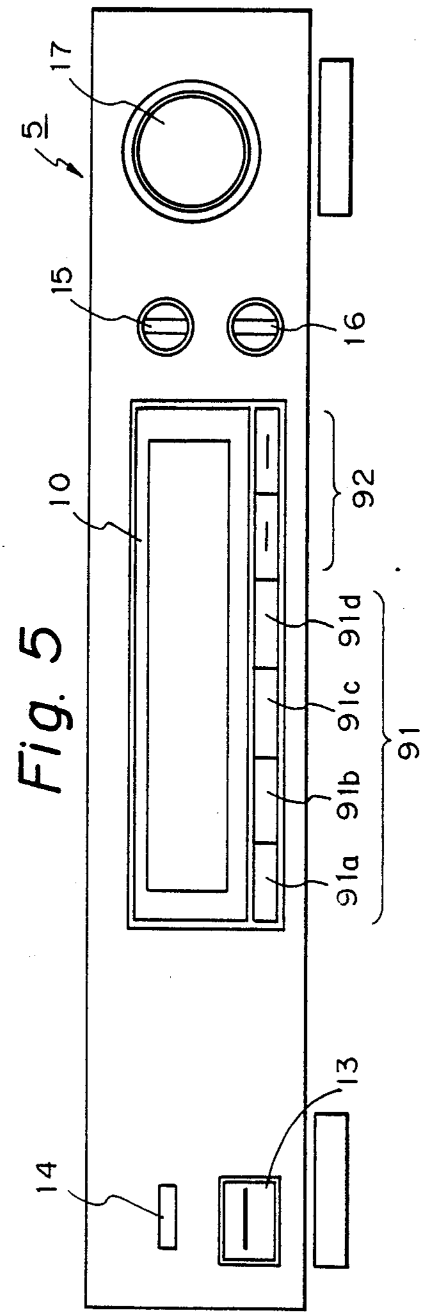
FIG. 5 is a front view of the DSP.

Referring now to FIG. 5, which is a front view of the DSP proper, the display 10 is centrally located at the front of the DSP. A more specific description of the display 10 will follow. Under the display 10 are a plurality of function switchover keys 91 constituting part of the controller 9, and mode switchover keys 92. These keys are disposed along the display 10. The function switchover keys 91 consist of an equalizer key 91*a*, a sound key 91*b*, a user program key 91*c*, and a sound field creation (SFC) key 91*d*. Selective usages of these four keys allow the DSP 5 to act as a digital equalizer, a surround processor, a sound field generator using reflected and reverberated sounds, or a sound field generator drawing on the user's own program. The mode switchover keys 92 consist of a "+" key and a "−" key for respectively incrementing and decrementing the order of stored programs when operated. The programs are skipped sequentially by operation of these two keys until a desired mode is reached.

To the left at the front of the DSP body are located a power switch 14 and a light-receiving element 14 for receiving light emissions from a remote controller. To the right of the display 10 are a knob 15 for adjusting the input level, a knob 16 for regulating the input balance, and a master volume knob 17.

Figure 6:
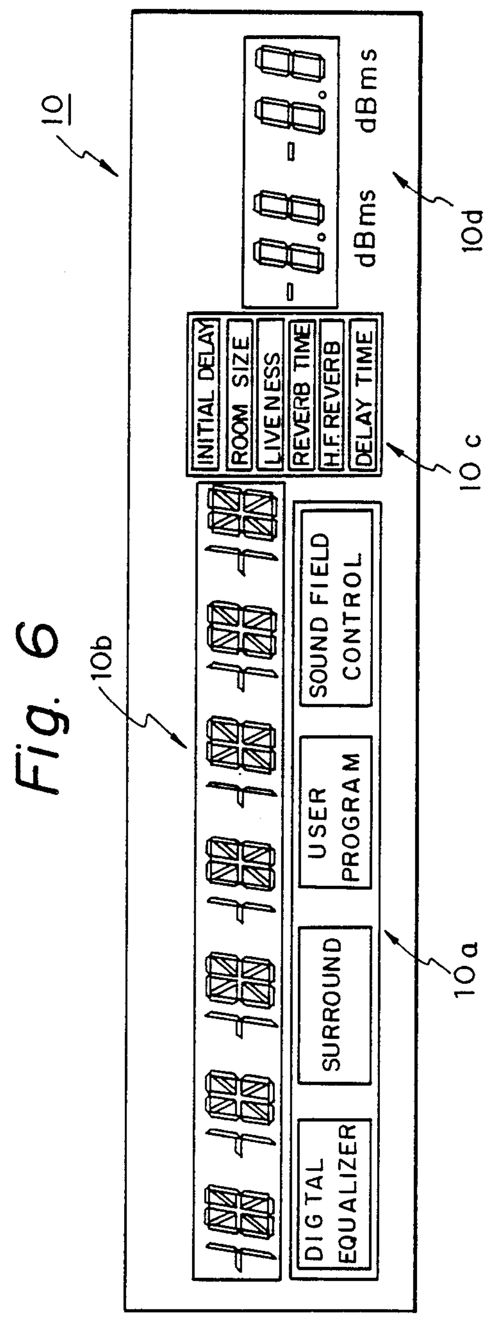
FIG. 6 is a front view showing an embodiment of the construction of a display for the DSP.

Referring to FIG. 6, there is illustrated an embodiment of the construction of the display 10 that comprises: a function display section 10*a* for illuminating the currently selected function, a character display section 10*b* for indicating in characters the identification name of the mode or program being selected; a parameter display section 10*c* for illuminating the parameter currently selected; and a data display section 10*d* for indicating the value of the selected parameter.

Figure 7:
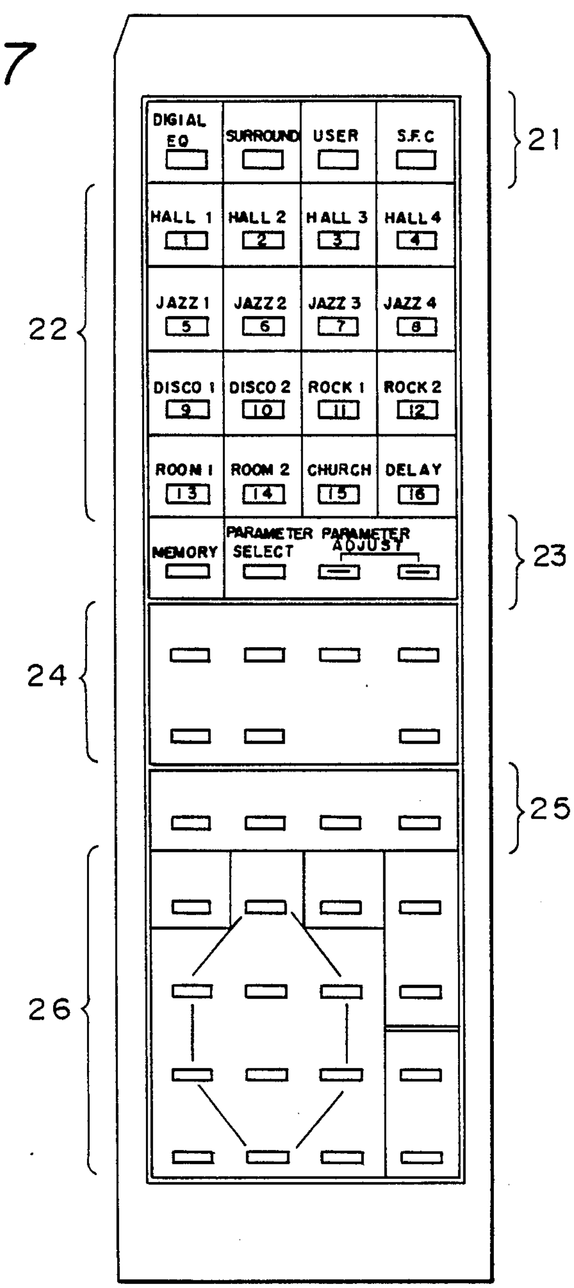
FIG. 7 is a front view showing an embodiment of the construction of a remote controller for the DSP.

Referring to FIG. 7, there is depicted an embodiment of a remote controller by which the DSP 5 is capable of being controlled. The remote controller comprises: a function switchover section 21 corresponding to the abovementioned four function switchover keys; a mode switchover section 22 typically consisting of 16 mode keys for selecting 16 different modes keyed to as many concert halls; a parameter adjusting section 23 for adjusting the parameters of the selected mode; an equalizer adjusting section 24 for adjusting both the equalizer function and the level of equalizing imposed on reflected and reverberated sounds from the SFC; a surround adjusting section 25 for adjusting the delay time and selecting a center mode when the surround function is selected; and a volume adjusting section 26 for regulating the sound volume in various manners. The parameter adjusting section 23 comprises: a memory key (without any numeral) for directing the storage of a user-modified program into the user program RAM 55 (see FIG. 4); a parameter selector key (without any numeral) for selecting parameters; and a "+" and a "−" key (without any numerals) for increment and decrementing the displayed value for parameter adjustment.

Figure 8:
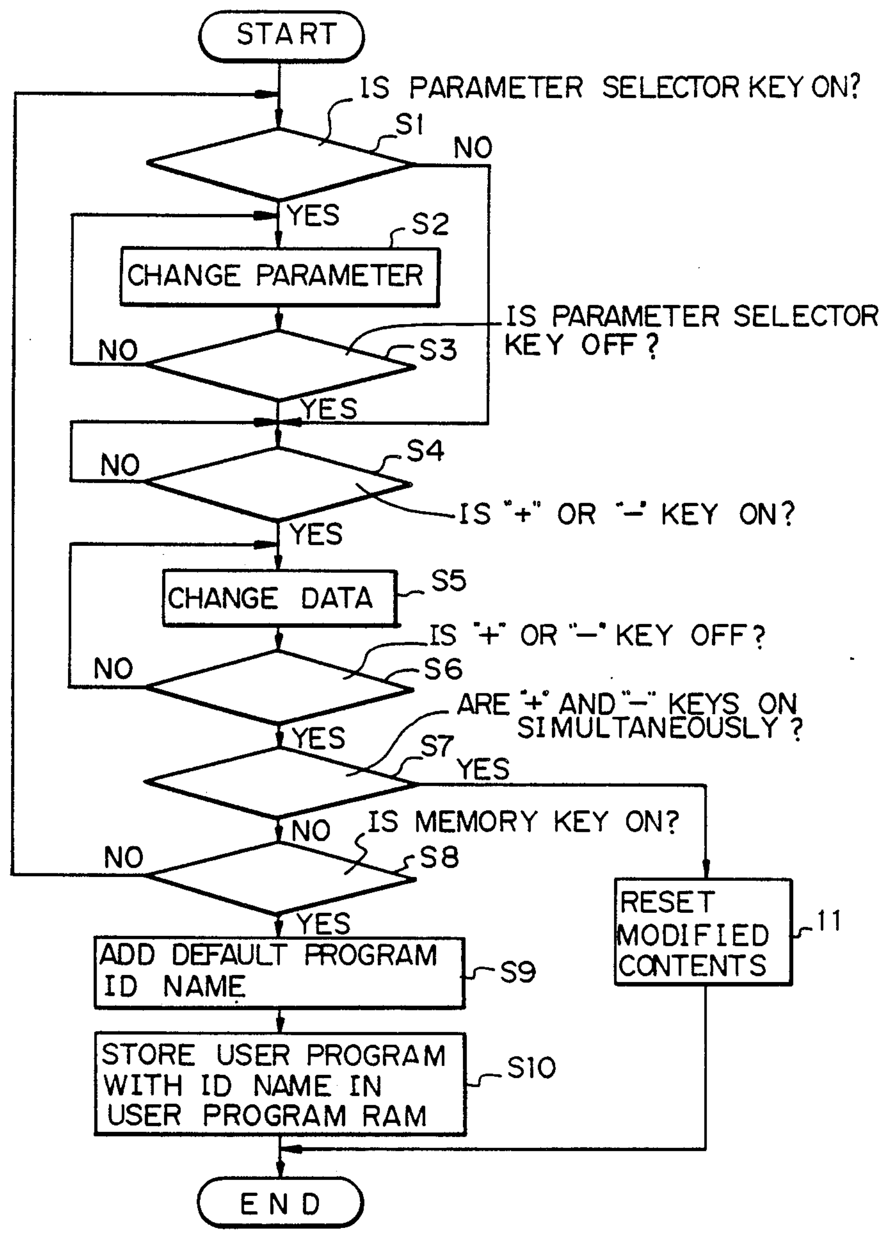
FIG. 8 is a flowchart showing the steps by which the user modifies the contents of programs.

Referring now to FIG. 8, there is shown a flowchart describing the steps by which a processor, when so specified by the user, modifies the contents of programs in such a sound field creation system as that depicted above. These steps are followed and executed by the processor forming a part of the arithmetic circuit 51. In this embodiment, an example of modifying program contents in a "HALL2" mode will be explained.

Where the "HALL2" mode is selected, the processor determines, in Step S1, whether or not a key input is made by the parameter selector key of the parameter adjusting section 23 on the remote controller (FIG. 7). If a key input is detected, the current parameter is replaced, in Step S2, by the next parameter. This process of parameter modification is repeated, in Step S3, until a predetermined time has elapsed with no more applicable key input detected following each key operation. When the key input by the parameter selector key is stopped, one of the above-mentioned parameters, i.e., initial delay, room size, liveness or reverb time, will have been selected. Once a parameter is selected, the processor waits, in Step S4, for a key input from the "+" or "−" key of the parameter adjusting section 23. When the processor judges in Step S1 that there is no key input made by the parameter selector key, the parameter in effect at that point in time is considered selected. Then Step S4 is reached directly, with the intervening steps skipped.

In Step S4, if the processor detects a key input made by the "+" or "−" key, then Step S5 is reached wherein the data in the selected parameter is modified. This process of parameter data modification is repeated, in Step S6, until a predetermined time has elapsed with no more key input detected following each key operation. When the parameter data has been modified, the processor checks to see, in Step S7, if the "+" and the "−" key are operated simultaneously. If no such simultaneous key input is detected, the processor determines, in Step S8, if any key input (of memory instruction) is made by the memory key of the parameter adjusting section 23. With no key input by the memory key detected, Step S1 is again reached, and the whole process is repeated from the beginning. If there is a key input by the memory key, the user program (i.e., modified program) obtained by modifying the corresponding default program is given a name, say "HALL2," that identifies the default program, in Step S9. The modified program is then stored, in Step S10, in that area of the user program RAM 55 that is specified by the information entered by, say, the "1" key of the mode switchover section 22 following the memory key input. This completes the whose series of the steps to modify the contents of a default program. On the other hand, if a simultaneous double-key input is detected in Step S7, the modified program is reset and replaced by the corresponding default program, in Step S11. This also completes the entire series of the above steps.

In calling a default program (basis for creating a desired sound field) for modification into a new program to be stored anew, the modified program contents may be reset by simply operating the "+" and "−" keys simultaneously. This arrangement eliminates the need for a separate reset key for reset action. Since the user modifying the default program with his fingertips can reset the current programming without deliberately moving them to another key, the controller is easier to operate.

When a user program prepared in the manner described above is to be executed, the desired program is called from the user program RAM 55 in two steps. First, the user program key of the function switchover section 21 is used to select the user program function. Then any of the keys "1" through "16" of the mode switchover section 22 is operated to select the desired mode. When suitable arithmetic operations are carried out on the contents of the selected program, the desired sound field is created.

Figure 9:
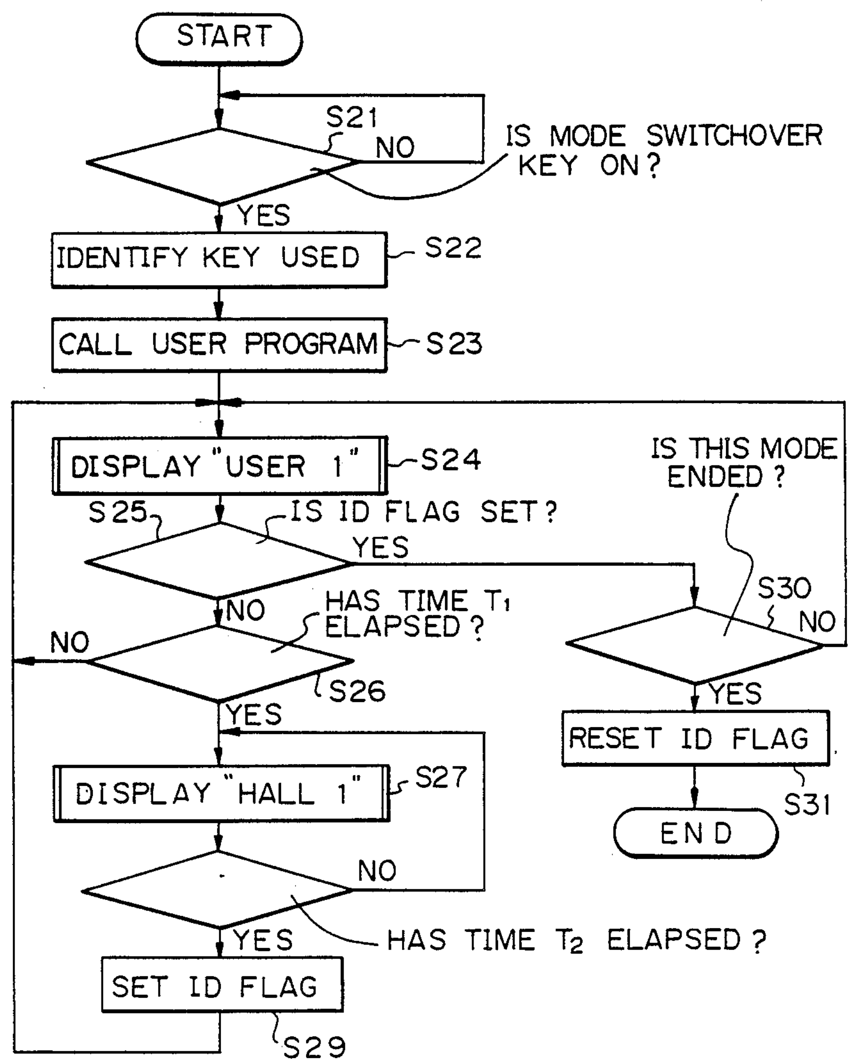
FIG. 9 is a flowchart showing the steps for displaying program identification information.

Referring now to FIG. 9, there is shown a flowchart describing the steps for displaying the information identifying a user program that is called from the user program RAM 55 and executed to implement its contents. What follows is a description of these steps in the order depicted in the flowchart. The entire processing involved is also performed by the processor forming part of the arithmetic circuit 51. It is assumed that when a user program is to be executed, the user program function is already selected by operation of the user program key of the function switchover section 21.

With the user program function selected, the processor determines, in Step S21, whether or not there is a key input from the mode switchover section 22. If a key input is detected, the processor determines, in Step S22, which key has been operated. If the operated key is, say, the "1" key, the user program stored in that area of the user program RAM 55 that corresponds to the input information of the "1" key is called, in Step S23. At the same time, the identification name "USER1" of the user program is indicated, in Step S24, on the character display section **10*b* of the display 10 on the DSP (see FIG. 6**).

The processor then determines whether or not an indentification flag, to be described later, is set. If the flag is not set, the processor determines, in Step S26, if a predetermined time $T_1$ has elapsed; the indication "USER1" is kept on the display until the predetermined time $T_1$ has passed. After the predetermined time $T_1$, the user program identification name "USER1" is replaced, in Step S27, on the character display section **10*b* by another name "HALL1" identifying the program stored in memory along with the user program and providing the basis for preparing that program. The processor then checks to see, in Step S28, if the predetermined time $T_1$ has elapsed; the indication "HALL1" is kept on the display until a predetermined time $T_2$ has elapsed. After the predetermined time $T_2$, the above-mentioned identification flag is set, in Step S29, indicating that the identification name of the program is displayed. Following this action, Step S24 is reached again, wherein the user program identification name "USER1" is again indicated on the character display section 10***b*.

From this point on, because the identification flag was found set in Step S25, the indication "USER1" is kept on until the processor finds this mode terminated in Step S30. When the processor does find this mode terminated in Step S30, it resets the identification flag, in Step S31. This completes the whole series of the steps for displaying the program identification name.

Where a user program is to be called and executed to implement its contents, there is a definite benefit for the user from the ability to display the name "HALL1" identifying the program providing the basis for preparing that user program. That is, the user can readily know the mode (i.e., concert hall type) of the sound field which could not be known from the user program identification name alone.

In the embodiment described above, the user program identification name "USER1" displayed first. The initial display is followed after the predetermined time $T_1$ by the name "HALL1" identifying the program providing the basis for preparing that user program. Then after the predetermined time $T_2$, the user program identification name "USER1" is again displayed. However, arrangements may be made so that instead of the user program identification name "USER1" being invoked again, the program identification name "HALL1" is allowed to remain until the current mode comes to an end.

As described so far, through the use of an audio signal processing apparatus according to the present invention, information identifying a user-modified program is displayed first whenever that user program is called. The display is followed after a predetermined time by that of information identifying the program on which the user program is based. That is, the user program identification name is supplemented sequentially by the information identifying the mode of the sound field providing the basis for creating a desired sound field using user-prepared parameter data. This setup allows the user to know easily the mode (i.e., concert hall type) of the sound field that could not be known solely from the information identifying the modified program.

Where the modification should be re-started, the contents of the modified program may be reset by simply operating simultaneously the "+" and "−" keys for set value increment and decrement. This reset operation replaces the contents of the modified program with those of the program without resorting to a separate reset key. Because the user need not relocate his fingertips for reset action during programming, the controller is easier to operate.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. An audio signal processing apparatus for sampling an input audio signal so as to produce sample values and apply a gain and/or delay to each of the sample values in accordance with a program for creating a specific sound field or fields, comprising:

a first memory means for storing at least one basic program providing the basis for creating said sound field and having first identification information identifying said program;

a first specifying means for specifying said basic program stored in said first memory means;

a supply means for supplying a modification command for modifying said basic program as well as second identification information identifying a modified program modified from said basic program on the basis of said modification command;

a second memory means;

an instruction means for giving a memory instruction to cause said modified program to be stored in said second memory means;

a control means for modifying the contents of the program specified by said first specifying means in accordance with said modification command and for storing said modified program into said second memory means in response to said memory instructions, together with the second identification information entered by said input means in addition to the first identification information on said basic program;

a second specifying means for specifying said modified program stored in said second memory means;

a display means for giving indications in accordance with display information signals supplied thereto; and a display control means for supplying said display means with the second identification information on the modified program specified by said second specifying means, and for supplying, after a predetermined time, the first identification information in the form of said display information signals.

2. An audio signal processing apparatus according to claim 1, wherein said display control means supplies said display means, for a predetermined time, with the first identification information of the program serving as the basis for said modified program specified, and then supplies again said display means with the second identification information of said modified program in the form of said display information signals.

3. An audio signal processing apparatus according to claim 1, wherein said supply means includes a pair of key switches for producing gain and/or delay/increment and decrement commands, said control means replaces the modified program with said basic program in case said pair of key switches are simultaneously operated before said memory instruction is issued.

4. An audio signal processing apparatus for sampling an input audio signal so as to produce sample values and apply a gain and/or a delay to each of the sample values in accordance with a program for creating a specific sound field or fields, comprising:

a first memory means for storing at least one basic program providing the basis for creating said sound field and having first identification information identifying said program;

a first specifying means for specifying said basic program stored in said first memory means;

a supply means for supplying a modification command for modifying said basic program as well as second identification information identifying a modified program modified from said basic program on the basis of said modification command;

a second memory means;

an instruction means for giving a memory instruction to cause said modified program to be stored in said second memory means;

a control means for modifying the contents of the program specified by said first specifying means in accordance with said modification command and for storing said modified program into said second memory means in response to said memory instructions, together with the second identification information entered by said input means in addition to the first identification information on said basic program;

a second specifying means for specifying said modified program stored in said second memory means, wherein said supply means includes of a pair of key switches for producing gain and/or delay increment and decrement commands, and said control means replaces the modified program with said basic program in case said pair of key switches are simultaneously operated before said memory instruction is issued.

* * * * *